United States Patent Office 2,942,158

Patented June 21, 1960

2,942,158

COPPER ALLOYS FOR ASYMMETRICAL CONDUCTORS AND COPPER OXIDE CELLS MADE THEREFROM

Kenneth E. Hassler, Ray E. Heiks, and Carl L. Meyer, Columbus, Ohio, assignors, by mesne assignments, to Westinghouse Air Brake Company, Swissvale, Pa., a corporation of Pennsylvania No Drawing. Filed Nov. 1, 1955, Ser. No. 544,364

5 Claims. (Cl. 317—138)

Our invention relates to copper alloys for asymmetrical and/or nonlinear conductors, and to copper oxide cells made from such alloys and having better electrical characteristics than heretofore obtainable.

In the manufacture of copper oxide rectifiers it has been found that heretofore rectifiers of acceptable electrical characteristics could only be made from commercial grades of copper obtained from certain mines. For the most part commercial copper oxide rectifiers are made from Chilean copper coming from the Chuquicamata mines. It has also been found that copper which comes from the same mine and from the same refinery will vary in some unknown way so that rectifier cells made from the same batch of copper may at times be of an inferior quality although all of the copper has been subjected to the same closely supervised processing methods. Moreover, rectifier cells made from start-of-pour copper are usually of better quality than rectifier cells made from the end of the same pour of copper. It is suspected that a greater concentration of impurities settles in the end-of-pour copper and it is these impurities which adversely affect the electrical characteristics of the rectifier cells. It has not been possible up to this time to detect or determine with any reasonable degree of certainity the particular impurities present in copper which have deleterious effects on the electrical characteristics of the cells. The adverse effects of these impurities have resulted in many processes of cell manufacture in an attempt to offset such effects, and in various treatments of the copper during cell manufacture to remove these impurities. These closely supervised methods of processing copper oxide rectifiers have improved certain electrical characteristics of the rectifiers, but after thirty years of manufacture, the voltage ratings of most copper oxide rectifiers are still of the order of 8.0 volts R.M.S. with cells usually operating at a current density of approximately 400 milliamperes per square inch. The low voltage ratings of these copper oxide rectifiers have limited the applications in which such rectifiers may be used economically.

Although some success has been attained in improving certain electrical characteristics of copper oxide rectifiers by the newer methods, we have discovered that further improvement, particularly in raising the voltage ratings of the copper oxide rectifiers, does not reside alone in different methods of manufacturing the cells, but rather that further marked improvements can be made by the elimination of those impurities in copper which have deleterious effects on the electrical characteristics of the cells, and in the addition to the copper of certain impurities which have a beneficial effect on cell characteristics. All of these latter benefits are obtained with little or no sacrifice in other desirable cell characteristics.

It is therefore an object of our invention to prepare commercially available copper for use in the manufacture of copper oxide cells in which certain deleterious impurities normally found in copper are held below specified maximum concentrations.

Another object of our invention is to provide copper alloys suitable for use in the manufacture of copper oxide cells having higher voltage ratings than those commonly manufactured.

Still a further object of our invention is to manufacture copper oxide cells by commonly employed procedures from copper alloys manufactured in accordance with our invention, the cells having several times the voltage rating of those commonly manufactured heretofore.

According to our invention we have discovered that certain impurities normally found in copper have a deleterious effect on the electrical characteristics of copper oxide cells, and that when these impurities in copper are removed or kept below specified concentrations and when other impurities are added to the copper in specified concentrations, the electrical characteristics of the copper oxide cells made from such copper are superior to the characteristics of the commonly available copper oxide cells. The improvement in the cells is such that the voltage ratings of the cells made in accordance with our invention may be extended to several times the 8.0 volts R.M.S. rating of prevalent copper oxide rectifiers.

We have discovered that certain impurities normally found in copper have a very marked effect on the electrical characteristics of the copper oxide cells. The particular impurities in copper which we have found to be most deleterious on the rectifier characteristics are certain elements of group VI of the periodic table, namely, selenium, tellurium and sulphur. We have found that very small concentrations of these elements in the copper lower the barrier height of the cells causing an increase in the reverse leakage current. The reverse resistance of the copper oxide cells tend to decrease as the concentrations of these elements in the copper increase.

We have also discovered that the addition of various concenertations of antimony to copper, from which the deleterious impurities have been removed, and/or in which the concentrations of the deleterious impurities are held below specified maximum concentrations, provides an alloy of copper from which copper oxide cells may be manufactured by standard procedures, the cells being of superior characteristics at higher operating voltages than heretofore obtainable from the better Chilean copper. We have also found that nickel and iron, when present in the copper alloy from which copper oxide cells are made, have an adverse effect on the forward resistance of the cells, the forward resistance increasing with increasing concentrations of these elements. The adverse effects of these elements are not as marked nor are the concentrations as critical as the effects and concentrations of selenium, tellurium and sulphur.

The concentrations of the elements in copper which we have found to have deleterious effects on the electrical characteristics of copper oxide cells made from such copper, and the concentrations of antimony added to copper which we have found to have beneficial effects, are very small; the concentrations being fractional percentages by weight. In the description hereinafter made and in the appended claims, to avoid the use of fractional or decimal percentage figures, the concentrations of the elements will be given in parts per million or p.p.m., it being understood that such concentrations are by weight.

We have found that concentrations of selenium in the range of 0.1 to 5.0 p.p.m., when present in copper, decrease both the forward and reverse resistances of the cells; the decrease in resistance being a function of increasing selenium concentration. A selenium concentration in copper of 0.5 p.p.m. or less, tends to lower the barrier height of the cell although the adverse effects on the reverse characteristics of the cell are small. Increases in the selenium concentration above 1.0 p.p.m. however, result in a lowering of the barrier height and a deterioration of the reverse resistance characteristics.

Tellurium has a very marked effect on the reverse resistance characteristics of rectifier cells made from copper containing this element. Tellurium concentrations of 0.5 p.p.m. or less, tend to have some adverse effects on the electrical characteristics, the adverse effects on the reverse characteristics being small. Concentrations of 1.0 p.p.m. of tellurium or more however, result in a deterioration of the reverse resistance characteristics. If the atomic percent of tellurium is considered, it is apparent that tellurium has a more marked effect on the electrical characteristics than selenium.

Small concentrations of sulphur in copper use in manufacturing copper oxide cells have also been found to adversely affect the electrical characteristics of copper oxide cells but such effects are not as marked as the effects of selenium or tellurium. Concentrations of up to 2.0 p.p.m. of sulphur show little effect on the electrical characteristics of the cells, but we have found that with concentrations of 5.0 p.p.m. of sulphur or more, the barrier height is lowered with the attendant increase in the reverse leakage current. The decrease in barrier height is a function of the increasing sulphur concentrations in the copper.

When two or more of these three deleterious impurities are present in copper used in manufacturing copper oxide cells, we have found that the total of five times the selenium content, plus five times the tellurium content, plus the sulphur content should be held below approximately 5.0 p.p.m. to obtain significantly improved rectifiers.

The presence of nickel in the copper alloy of our invention from which copper oxide cells are manufactured, increases the forward and reverse resistance of the cells. For example, the presence of approximately 20 p.p.m. of nickel more than doubles the forward resistance of the cells over those cells made from the same copper in which nickel is absent. Preferably, the nickel content of the copper should be held as low as economically possible and preferably below 20 p.p.m.

The effects of iron concentrations in the copper used in manufacturing copper oxide cells are found to be similar to those of nickel, but not as marked or pronounced. The total of one-half the iron content plus the nickel content of copper used for manufacturing copper oxide cells should total less than approximately 20 p.p.m. For cells having optimum electrical characteristics, the total of the nickel content plus one-half the iron content in copper is preferably less than approximately 2.5 p.p.m.

We have discovered that by adding antimony to copper having a total impurity content of not more than approximately 200 p.p.m., exclusive of oxygen, and from which the deleterious impurities enumerated are removed or reduced to the tolerable concentrations, which copper we shall hereinafter refer to as special purity copper, we are able to manufacture copper oxide cells having resistance characteristics which are superior to the characteristics of cells made from Chilean copper particularly at operating voltages in excess of those commonly employed heretofore. We have discovered that by adding to, or doping special purity copper with as little as 50 p.p.m. of antimony, the barrier height of the cells made from such copper is increased and such cells have better electrical characteristics than cells made from Chilean copper. Rectifiers made from such cells not only have better forward and reverse resistance characteristics when operated at voltages higher than the 8 volts R.M.S. per cell normal for the Chilean copper rectifiers used as a control, but also evidence much better reverse stability characteristics at the higher voltages than the control cells. We have found that the forward and reverse resistances of the special purity copper oxide cells and the forward aging of these cells fall within the useable range with concentration of antimony ranging from 50 p.p.m. up to approximately 7500 p.p.m. At 7500 p.p.m. of antimony and above difficulty is experienced in obtaining rectifiers with good adherent oxide coatings. The reverse stability characteristics of the special purity cells, however, are dependent upon the antimony concentrations. Excellent reverse aging characteristics of the cells are obtainable with antimony concentrations of from approximately 200 p.p.m., but we have found that when the concentrations of antimony are more than approximately 3500 p.p.m., the forward aging of the cells made from such copper tends to increase.

Copper oxide rectifier cells may thus be manufactured from special purity copper with concentrations of antimony in the ranges hereinbefore specified, which have better reverse characteristics than cells made from control copper. We have found that copper oxide cells having improved electrical characteristics may be obtained from copper having a total impurity content of not more than approximately 200 p.p.m., exclusive of oxygen, and in which the total of five times the selenium content plus five times the tellurium content plus the sulphur content is hed below approximately 5.0 p.p.m. and to which from approximately 50 to approximately 7500 p.p.m. of antimony are added. For tolerable forward characteristics where current density requirements are not high, the total of the nickel content plus one half the iron content should not be more than 20 p.p.m.

For optimum results to obtain copper oxide cells which may be rated at approximately 18.0 volts R.M.S. or better, the copper alloy used for manufacturing the cells should have a total impurity content of not more than 200 p.p.m., exclusive of oxygen, and in which the total of five times the selenium content plus five times the tellurium content plus the sulphur content should not be more than approximately 5.0 p.p.m. and the antimony content should be between approximately 800 to 3500 p.p.m. For improved forward characteristics, the total of the nickel content plus one half of the iron content in the alloy should not be more than 2.5 p.p.m.

The improvements in the reverse aging characteristics of copper oxide rectifier cells through the use of antimony concentrations in special purity copper have been such that we have been able to manufacture rectifiers from special purity copper having an antimony concentration of 2000 p.p.m. which have been tested with 40 volts D.C. applied to the rectifiers in the reverse direction in an ambient of 70° C. for hours without abnormal adverse effects being noted either in the forward or reverse stability of the cells.

According to our invention, therefore, we provide a special purity copper preferably of approximately 99.98% or better purity, exclusive of oxygen, and substantially free of the deleterious elements hereinbefore set forth, to which antimony is added. We have found it desirable to limit the total amount of impurities in the copper to approximately 200 p.p.m. or less, exclusive of oxygen; the total concentrations of impurities in the copper including the specified limitations of the concentrations of the deleterious elements hereinbefore enumerated. In preparing the special purity copper for manufacturing copper oxide cells we electrolytically and/or zone refine commercially available copper to obtain the stated purity. In this refining extreme care must be taken that the copper is in no way contaminated either by airborne particles or by the apparatus used in refining, such as the crucibles, molds, etc.

In zone refining copper, an ingot of suitable dimensions is disposed within a high purity graphite boat or elongated crucible, the boat being disposed within a quartz tube. In zone refining, the copper is melted either in a vacuum or under an inert gas in zones by a suitable electrical heating coil which is passed very slowly along the ingot from one end to the other, the heating coil making several passes in the same direction. It has been found in zone refining copper that the most undesirable impurities, being more soluble in the liquid phase of the copper, are picked up as the molten zone advances, leaving behind a purer form of copper. Those impurities in copper tending to lower the melting point of copper, such as sulphur, selenium and tellurium, are removed from the front and center portion and are concentrated in the rear portion of the ingot, while those impurities which tend to increase the melting point of copper, such as iron and nickel, are removed from the center and rear portion and are concentrated in the front portion of the ingot. After several passes of the heating coil, the copper ingot is removed from the tube and the impure ends of the ingot are cut off. The remaining portion of the zone refined ingot is used in the manufacture of our improved copper oxide cells. It has been found that the copper of the center portion of the zone refined ingot is approximately 99.999% pure, exclusive of oxygen, with the concentrations of the undesirable impurities well below the stated maximums.

The special purity copper used by us in the manufacture of copper oxide cells may also be provided by electrolytically re-refining commercially available electrolytic copper. In re-refining the copper precautions must be taken to prevent contamination of the copper. In preparing our special purity copper we prefer to plate the copper on cathode blanks from a high purity cupric sulphate plating bath. The cathodes are separated in the bath from the copper anodes by suitable filters to keep objectionable impurities from reaching the cathodes. After the copper has been deposited to a desired thickness, the cathodes are removed from the plating bath and the copper stripped away from the cathode blanks. Any remaining sulphur is removed in the further processing of the copper. The electrolytically refined copper is also approximately 99.999% pure with the concentrations of the selenium and tellurium below the concentrations hereinbefore given.

In the further preparation of the special purity copper for the manufacture of rectifier cells we cut the zone or electrolytically re-refined copper into proper lengths for insertion into an inductively heated high purity carbon crucible and melt it. A flow of filtered pure air is directed across the surface of the molten copper. This step removes certain impurities, such as sulphur, and is continued for five or ten minutes. The surface of the melt is then covered with graphite chips and the melt stirred, preferably under a cover of a nonoxidizing gas. This step facilitates level casting. The alloying element is then added in its elemental form and the melt stirred. The graphite chips are completely skimmed off and the melt exposed to pure air for a moment and then poured through air into a mold.

The molds into which the copper alloy is poured are preferably made of copper. When a copper mold is used, the mold is first heated and sprayed with a water slurry of bone ash (tri calcium phosphate). The mold now having a white lining of bone ash is preferably heated to between 400 and 500° F. before casting. The copper melt should be cast under a flow of purified air to prevent contamination of the copper. Immediately after the ingot solidifies at the top, the mold still containing the ingot is water quenched. The ingot of prepared copper, after a suitable cleaning operation is now ready for rolling.

The rolling of the special purity copper alloy should also be carefully done to prevent contamination or inclusion of any foreign matter in the copper. The copper alloy ingot may either be hot rolled or cold rolled as desired to sheets of the required thickness.

The sheets of the special purity copper alloy may then be cut to size and rectifier cells punched therefrom in the usual manner. In preparing copper oxide cells from the special purity copper alloy provided herein, we have used only standard manufacturing methods. An example of one such method of manufacturing copper oxide cells is to subject the copper blanks to a suitable cleaning process which may include a dip in nitric acid solution followed by a rinse in distilled water. The blanks may then be oxidized for thirteen minutes, the copper blanks preferably being oxidized in the presence of air for about seven minutes at approximately 1030° C. and then placed at the same oxidizing temperature in a second furnace in the presence of chlorine for the remainder of the oxidizing period. The blanks are then withdrawn from the furnace and permitted to cool in air to approximately 538° C., and then placed in a furnace and annealed at the latter temperature for approximately ten minutes. The annealed blanks are then preferably quenched in water and dried by blasts of air. The cupric oxide layer formed on the blanks is then removed by a sulphuric acid-hydrochloric acid solution followed by a rinse in water and dried by air blasts. The blanks are then dipped in a concentrated nitric acid solution, rinsed in water and then dried.

The outlined procedure is one typical of many procedures used in manufacturing copper oxide cells and may be varied in accordance with the particular characteristics demanded. As is well known in the art, the forward and reverse characteristics of copper oxide cells may be varied by varying the oxidizing time of the cell either in the presence of air or in the presence of chlorine, or by varying the type of quench the cells are given after annealing. The special purity copper alloy provided by us is readily adapted to any of the known standard procedures. Because of the special purity of the copper used and the added concentrations of antimony as hereinbefore set forth, copper oxide cells manufactured by these standard procedures will have better forward and reverse resistance characteristics and operate at higher voltages than cells made from the heretofore standard Chilean copper.

Although we have described several alloys of copper for the manufacture of copper oxide cells embodying our invention, it is understood that various changes and modifications may be made therein within the scope of the appended claims without departing from the spirit and scope of our invention.

Having thus described our invention, what we claim is:

1. The method of preparing copper alloys for the manufacture of copper oxide cells comprising refining copper to a purity of approximately 99.999%, melting the refined copper in a high purity graphite container, adding graphite chips to the molten copper and stirring, adding approximately 50 to 7500 p.p.m. of antimony to the molten copper under a flow of a nonoxidizing gas and stirring, skimming off the graphite chips, and pouring the molten alloy under a flow of purified air into a preheated mold.

2. A process of manufacturing copper oxide cells comprising, refining copper to a purity in which the total of 5 times the selenium content plus 5 times the tellurium content plus the sulphur content is not more than approximately 5.0 p.p.m. and in which the total of all impurities is less than 200 p.p.m., exclusive of oxygen; melting the refined copper, adding graphite chips to the molten copper and stirring, adding 50 to 7500 p.p.m. of antimony to the molten copper under a cover of a nonoxidizing gas, removing the graphite chips, casting the copper under a cover of purified air, rolling the cast copper into sheets, forming blanks from the copper sheets, and oxidizing the copper blanks.

3. A process of manufacturing copper oxide cells comprising, electrolytically re-refining copper to a purity in which the total of all impurities, exclusive of oxygen, is less than approximately 200 p.p.m., and in which the selenium content is not more than approximately 1.0 p.p.m., and the tellurium content is not more than approximately 1.0 p.p.m.; melting the re-refined copper and maintaining the copper molten under a cover of purified air to reduce the sulphur content of the copper to not more than approximately 5.0 p.p.m., adding graphite chips to the molten copper and stirring, adding 50 to 7500 p.p.m. of antimony to the molten copper under a cover of a nonoxidizing gas, removing the graphite chips, casting the copper under a cover of purified air, rolling the cast copper into sheets, forming blanks from the sheets, and oxidizing the copper blanks.

4. A copper oxide cell comprising a body composed of copper in which the content of sulphur plus 5 times the content of selenium plus 5 times the content of tellurium is not more than about 5 p.p.m., in which the total of one-half the iron content plus one-half the nickel content is less than 2.5 p.p.m., in which the total content of all impurities other than oxygen is not more than 200 p.p.m., and to which approximately 800 to 3500 p.p.m. of antimony have been added, and an oxide layer on said body.

5. A copper oxide cell comprising a body composed of copper in which the sulphur content is less than 5 p.p.m., the selenium content is less than 1 p.p.m., the tellurium content is less than 1 p.p.m., the iron content is less than 20 p.p.m., the nickel content is less than 20 p.p.m., in which the total content of all impurities other than oxygen is not more than 200 p.p.m., and to which 50 to 7500 p.p.m. of antimony have been added, and an oxide layer on said body.

References Cited in the file of this patent

UNITED STATES PATENTS

| | | |
|---|---|---|
| 2,162,362 | Smith | June 13, 1939 |
| 2,166,354 | Heuer | July 18, 1939 |
| 2,244,093 | Wilkins | June 3, 1941 |
| 2,246,328 | Smith | June 17, 1941 |
| 2,256,481 | Hulme et al. | Sept. 23, 1941 |
| 2,559,031 | Sykes | July 3, 1951 |
| 2,603,563 | Crome | July 15, 1952 |
| 2,701,285 | Irby | Feb. 1, 1955 |

OTHER REFERENCES

ASME Handbook, Metals Propertires, edited by S. L. Hoyt, First Edition, McGraw-Hill Book Co. Inc., New York; received in Patent Office October 26, 1954; page 299.

"The Effect of Impurities in Copper on the Electrical Character of Copper-Oxide Rectifiers," P. V. Sharavski, Journal of Technical Physics (U.S.S.R., 1942), vol. XII, pages 149–168.

"The Effect of Certain Elements on the Properties of High-Purity Copper," Smart et al., The Metal Industry, September 3, 1943; pages 150–153.

"Studies on Copper Plates for Cuprous Oxide Rectifiers; Effect of Impurities in Copper for Cuprous Oxide Rectifier Elements," Takeda. Abstracted in Metallurgical Abstracts, vol. 23, 1955. Page 260.

Journal of Metals, November 1953. Pages 1428–1429.